(12) United States Patent
Chen

(10) Patent No.: US 11,881,493 B2
(45) Date of Patent: Jan. 23, 2024

(54) SEMICONDUCTOR IMAGE SENSOR DEVICE

(71) Applicant: UNITED MICROELECTRONICS CORP., Hsin-Chu (TW)

(72) Inventor: Ming-Shing Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/990,755

(22) Filed: Nov. 21, 2022

(65) Prior Publication Data

US 2023/0082279 A1  Mar. 16, 2023

Related U.S. Application Data

(63) Continuation of application No. 16/794,233, filed on Feb. 19, 2020, now Pat. No. 11,538,844.

(30) Foreign Application Priority Data

Jan. 15, 2020 (CN) .......................... 202010040976.7

(51) Int. Cl.
    *H01L 27/146* (2006.01)
    *H01L 23/532* (2006.01)
    *H01L 29/49* (2006.01)
    *H01L 21/768* (2006.01)
    *H01L 29/66* (2006.01)
    *H01L 29/417* (2006.01)

(52) U.S. Cl.
    CPC .. *H01L 27/14612* (2013.01); *H01L 23/53295* (2013.01); *H01L 27/14614* (2013.01); *H01L 27/14636* (2013.01); *H01L 27/14643* (2013.01); *H01L 27/14689* (2013.01); *H01L 29/4933* (2013.01); *H01L 21/76889* (2013.01); *H01L 21/76897* (2013.01); *H01L 23/53209* (2013.01); *H01L 27/14632* (2013.01); *H01L 27/14687* (2013.01); *H01L 29/41725* (2013.01); *H01L 29/665* (2013.01)

(58) Field of Classification Search
    None
    See application file for complete search history.

(56) References Cited

U.S. PATENT DOCUMENTS

| | | | |
|---|---|---|---|
| 5,291,058 A | * | 3/1994 | Samata ................. H01L 29/456 257/641 |
| 6,287,951 B1 | | 9/2001 | Lucas |
| 6,303,406 B1 | | 10/2001 | Chen |

(Continued)

FOREIGN PATENT DOCUMENTS

CN         107924921 A    4/2018

*Primary Examiner* — Scott B Geyer
(74) *Attorney, Agent, or Firm* — Winston Hsu

(57) ABSTRACT

An image sensor device includes a transistor disposed in a pixel region; a salicide block layer covering the pixel region; a first ILD layer covering the salicide block layer; a second ILD layer on the first ILD layer; a source contacts extending through the second and first ILD layers and the salicide block layer, and including first polysilicon plug in the first ILD layer and first conductive metal layer on the first polysilicon plug; and a drain contact extending through the second and first ILD layers and the salicide block, and including second polysilicon plug in the first ILD layer and second conductive metal layer on the second polysilicon plug.

11 Claims, 9 Drawing Sheets

(56) References Cited

U.S. PATENT DOCUMENTS

| | | | |
|---|---|---|---|
| 6,448,595 B1* | 9/2002 | Hsieh | H01L 27/14643 257/292 |
| 6,635,576 B1 | 10/2003 | Liu | |
| 7,064,067 B1 | 6/2006 | King | |
| 10,170,376 B1 | 1/2019 | Hung | |
| 10,971,397 B2 | 4/2021 | Hsu | |
| 2001/0010402 A1 | 8/2001 | Matsuki | |
| 2001/0053572 A1 | 12/2001 | Ichihashi | |
| 2002/0031910 A1 | 3/2002 | Chen | |
| 2002/0153544 A1 | 10/2002 | Ogata | |
| 2002/0158280 A1 | 10/2002 | Shinkawata | |
| 2004/0029378 A1 | 2/2004 | Kang | |
| 2004/0147082 A1 | 7/2004 | Kim | |
| 2004/0188771 A1 | 9/2004 | Yaung | |
| 2005/0093147 A1 | 5/2005 | Tu | |
| 2006/0011952 A1* | 1/2006 | Ohkawa | H01L 27/14689 257/292 |
| 2006/0228843 A1* | 10/2006 | Liu | H01L 21/823412 257/E21.619 |
| 2007/0001235 A1 | 1/2007 | Rhodes | |
| 2007/0010051 A1 | 1/2007 | Wu | |
| 2007/0131988 A1 | 6/2007 | Lin | |
| 2007/0161218 A1 | 7/2007 | Ichinose | |
| 2007/0241375 A1 | 10/2007 | Sze | |
| 2008/0029793 A1* | 2/2008 | Watanabe | H01L 27/14612 257/E31.128 |
| 2008/0128823 A1 | 6/2008 | Takeoka | |
| 2008/0290421 A1 | 11/2008 | Wang | |
| 2009/0283907 A1 | 11/2009 | Goswami | |
| 2010/0279459 A1* | 11/2010 | Huang | H01L 27/14689 438/98 |
| 2011/0006437 A1 | 1/2011 | Tsao | |
| 2011/0027950 A1* | 2/2011 | Jones | H01L 27/14643 438/155 |
| 2012/0056245 A1 | 3/2012 | Kang | |
| 2012/0104514 A1 | 5/2012 | Park | |
| 2012/0326241 A1 | 12/2012 | Haran | |
| 2014/0252620 A1 | 9/2014 | Huang | |
| 2014/0264641 A1* | 9/2014 | Frohberg | H01L 29/4175 438/667 |
| 2014/0332868 A1 | 11/2014 | Kao | |
| 2015/0076500 A1 | 3/2015 | Sakaida | |
| 2015/0155173 A1* | 6/2015 | Hirota | H01L 29/4983 438/682 |
| 2015/0214269 A1* | 7/2015 | Endo | H01L 21/02321 257/443 |
| 2015/0372102 A1* | 12/2015 | Usami | H01L 29/41775 257/327 |
| 2016/0064518 A1 | 3/2016 | Liu | |
| 2016/0099321 A1* | 4/2016 | Frohberg | H01L 23/485 257/384 |
| 2016/0211139 A1 | 7/2016 | Ko | |
| 2017/0069726 A1 | 3/2017 | Kye | |
| 2017/0222013 A1 | 8/2017 | Makiyama | |
| 2018/0158733 A1* | 6/2018 | Kamineni | H01L 21/76898 |
| 2018/0182802 A1* | 6/2018 | Tange | H01L 21/76846 |
| 2020/0395459 A1 | 12/2020 | Singh | |
| 2021/0050255 A1 | 2/2021 | Hsu | |
| 2021/0335792 A1 | 10/2021 | Su | |

\* cited by examiner

SEMICONDUCTOR IMAGE SENSOR DEVICE

CROSS REFERENCE TO RELATED APPLICATIONS

This application is a continuation application of U.S. application Ser. No. 16/794,233, filed on Feb. 19, 2020. The content of the application is incorporated herein by reference.

BACKGROUND OF THE INVENTION

1. Field of the Invention

The present invention relates to the field of semiconductor technology, and in particular, to a semiconductor image sensor device and a manufacturing method thereof.

2. Description of the Prior Art

A conventional unit pixel of a CMOS image sensor is composed of a buried photodiode (BPD) and four NMOS transistors. The four NMOS transistors include a transfer transistor for transferring photoelectric charges generated in a buried photodiode to a sensing node, a reset transistor for resetting the sensing node in order to sense a next signal, a drive transistor for acting as a source follower, and a select transistor for outputting data to an output terminal in response to an address signal.

In CMOS image sensors, self-aligned silicide can be used to improve RC delay. However, the conventional self-aligned silicide process has certain limitations in its application to CMOS image sensors. The formation of silicide in most areas of the photosensitive area of a CMOS image sensor (such as the photodiode area and the source/drain area in the photoactive area) usually results in an increase in leakage current, which reduces the image quality of the sensor.

Dark current is the most problem to be overcome in current CMOS image sensor technology. It is known that dark current may come from silicon damage and metal contamination. Among them, one of the sources of metal pollution is tungsten and metal silicide in the contact hole. In order to reduce dark current, CMOS image sensors usually use a non-silicide metal process, but the disadvantage is that the contact resistance of the pixels is high, which results in poor device performance.

SUMMARY OF THE INVENTION

One object of the present invention is to provide an improved semiconductor image sensor device and a manufacturing method thereof to overcome the deficiencies and disadvantages in the prior art.

One aspect of the invention provides a semiconductor image sensor device including a semiconductor substrate having an image-sensing pixel region. A MOS transistor is disposed on the semiconductor substrate within the image-sensing pixel region. The MOS transistor includes a source region, a drain region spaced apart from the source region, a channel region between the source region and the drain region, and a gate over the channel region. A salicide block (SAB) layer covers the MOS transistor and the image-sensing pixel region. A first interlayer dielectric (ILD) layer covers the SAB layer. A second ILD layer is deposited directly on the first ILD layer. A source contact is disposed on the source region. The source contact extends through the second ILD layer, the first ILD layer, and the SAB layer. The source contact includes a first doped polysilicon plug in the first ILD layer and a first conductive metal layer in the second ILD layer. A drain contact is disposed on the drain region. The drain contact extends through the second ILD layer, the first ILD layer, and the SAB layer. The drain contact includes a second doped polysilicon plug in the first ILD layer and a second conductive metal layer in the second ILD layer.

According to some embodiments of the invention, the first doped polysilicon plug is in direct contact with the source region and the second doped polysilicon plug is in direct contact with the drain region.

According to some embodiments of the invention, the first doped polysilicon plug and the second doped polysilicon plug comprise $N^+$ doped polysilicon.

According to some embodiments of the invention, the semiconductor image sensor device further includes a gate contact on the gate, the gate contact extending through the second ILD layer, the first ILD layer, and the SAB layer, and the gate contact comprising a third doped polysilicon plug in the first ILD layer and a third conductive metal layer in the second ILD layer.

According to some embodiments of the invention, the first conductive metal layer, the second conductive metal layer, and the third conductive metal layer comprise tungsten, aluminum, titanium, titanium nitride, tantalum, or tantalum nitride.

According to some embodiments of the invention, third doped polysilicon plug is in direct contact with the third conductive metal layer.

According to some embodiments of the invention, a thickness of the first ILD layer directly above the gate is smaller than 300 angstroms.

According to some embodiments of the invention, the SAB layer comprises a silicon oxide layer.

According to some embodiments of the invention, the first doped polysilicon plug is in direct contact with the first conductive metal layer.

According to some embodiments of the invention, the second doped polysilicon plug is in direct contact with the second conductive metal layer.

According to some embodiments of the invention, no silicide layer is disposed on the source region, the drain region or the gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
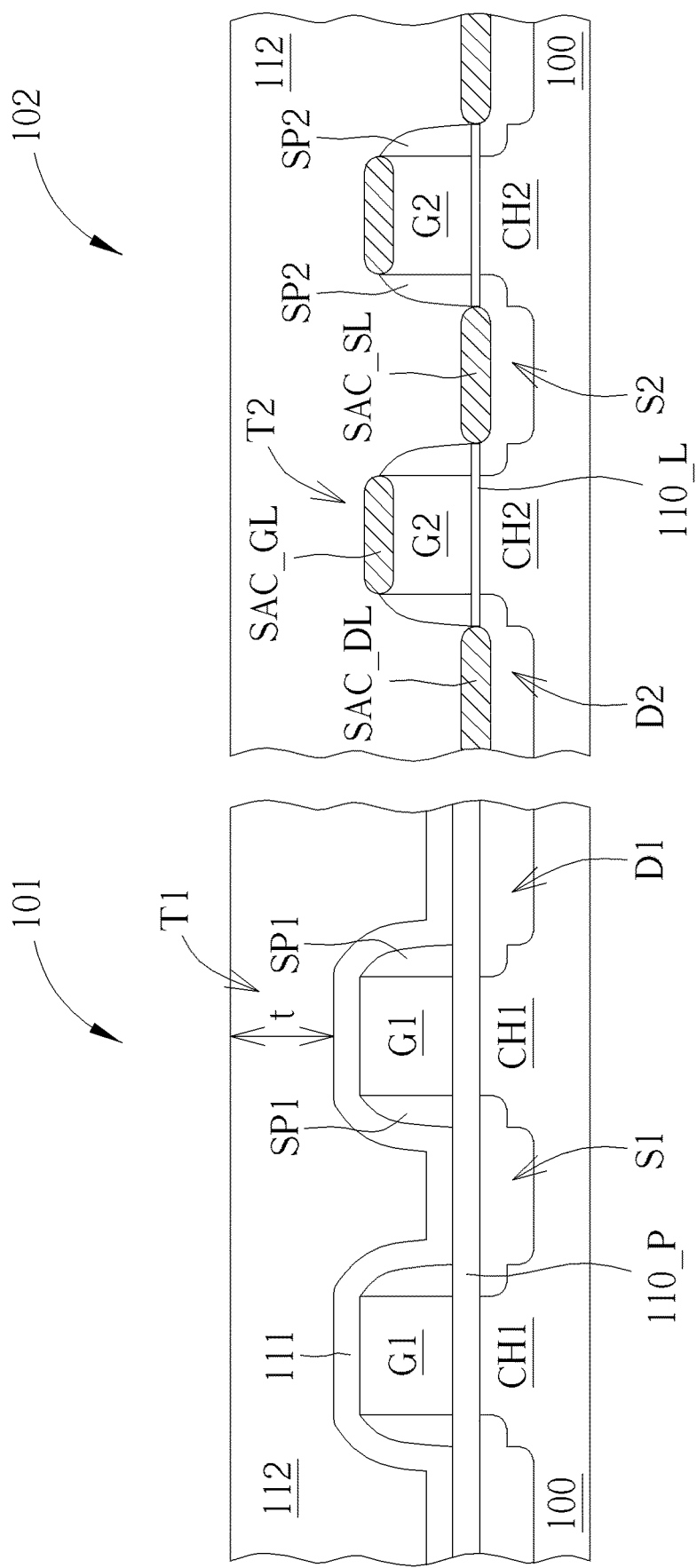
FIG. 1 to FIG. 8 are schematic cross-sectional views showing a method for manufacturing a semiconductor image sensor device according to an embodiment of the present invention.

Please refer to FIG. 1 to FIG. 8, which are schematic cross-sectional views showing a method for manufacturing a semiconductor image sensor device according to an embodiment of the present invention. As shown in FIG. 1, a semiconductor substrate 100 is first provided, for example, a silicon substrate, but is not limited thereto. The semiconductor substrate 100 includes an image-sensing pixel region (hereinafter referred to as a pixel region) 101 and a logic circuit region 102. A metal-oxide-semiconductor (MOS) transistor T1 has been formed in the pixel region 101 and includes a gate G1, a source region S1, and a drain region D1. Between the source region S1 and the drain region D1 is a channel region CH1, and the gate G1 is located on the channel region CH1. A MOS transistor T2 has been formed in the logic circuit region 102 and includes a gate G2, a source region S2, and a drain region D2. Between the source region S2 and the drain region D2 is a channel region CH2, and the gate G2 is located on the channel region CH2.

According to an embodiment of the present invention, a gate dielectric layer 110_P is formed between the gate G1 of the MOS transistor T1 and the semiconductor substrate 100. A gate dielectric layer 110_L is formed between the gate G2 of the MOS transistor T2 and the semiconductor substrate 100. According to the embodiment of the present invention, a spacer SP1 may be formed on the sidewall of the gate G1 of the MOS transistor T1, and a spacer SP2 may be formed on the sidewall of the gate G2 of the MOS transistor T2.

According to the embodiment of the present invention, a self-aligned silicide layer SAC_GL and a self-aligned silicide layer SAC_SL and a self-aligned silicide layer SAC_DL have been formed on the gate G2, the source region S2 and the drain region D2 of the MOS transistor T2 in the logic circuit region 102, respectively. It is worth noting that at this point, the self-aligned silicide layer is formed only in the logic circuit region 102, and no self-aligned silicide layer is formed on the MOS transistor T1 includes a gate G1, a source region S1, and a drain region D1 in the pixel region 101. In this way, metal contamination can be avoided and dark current can be reduced.

The self-aligned silicide process first deposits a thin metal layer, such as titanium, cobalt, nickel, etc., on a wafer on which a semiconductor element (such as a transistor) has been formed. Next, the wafer is heated so that the metal reacts with the exposed silicon in the active region (for example, the source region, the drain region, and the gate) of the semiconductor element to form a low-resistance metal silicide. The metal does not react with the silicon oxide and/or nitride insulating layers present on the wafer. After the reaction, any remaining metal is removed by chemical etching, leaving only silicide contacts in the active area of the element.

Before performing the above-mentioned self-aligned silicide process on the gate G2, source region S2, and drain region D2 of the MOS transistor T2 in the logic circuit region 102, a salicide block (SAB) layer 111 such as silicon oxide or silicon nitride is formed in the pixel region 101 to cover the MOS transistor T1. After the self-aligned silicide layer SAC_GL, self-aligned silicide layer SAC_SL and self-aligned silicide layer SAC_DL on the gate G2, source region S2, and drain region D2 of the MOS transistor T2 in the logic circuit region 102 an interlayer dielectric (ILD) layer 112 is deposited. The interlayer dielectric layer 112 covers the pixel region 101 and the logic circuit region 102. In the pixel region 101, the interlayer dielectric layer 112 covers the salicide block layer 111. The interlayer dielectric layer 112 may be a silicon oxide layer or a low dielectric constant material layer, but is not limited thereto. According to the embodiment of the present invention, the thickness t of the interlayer dielectric layer 112 directly above the gate G1 may be less than 300 angstroms, for example, 200 to 300 angstroms, but is not limited thereto.

Figure 2:
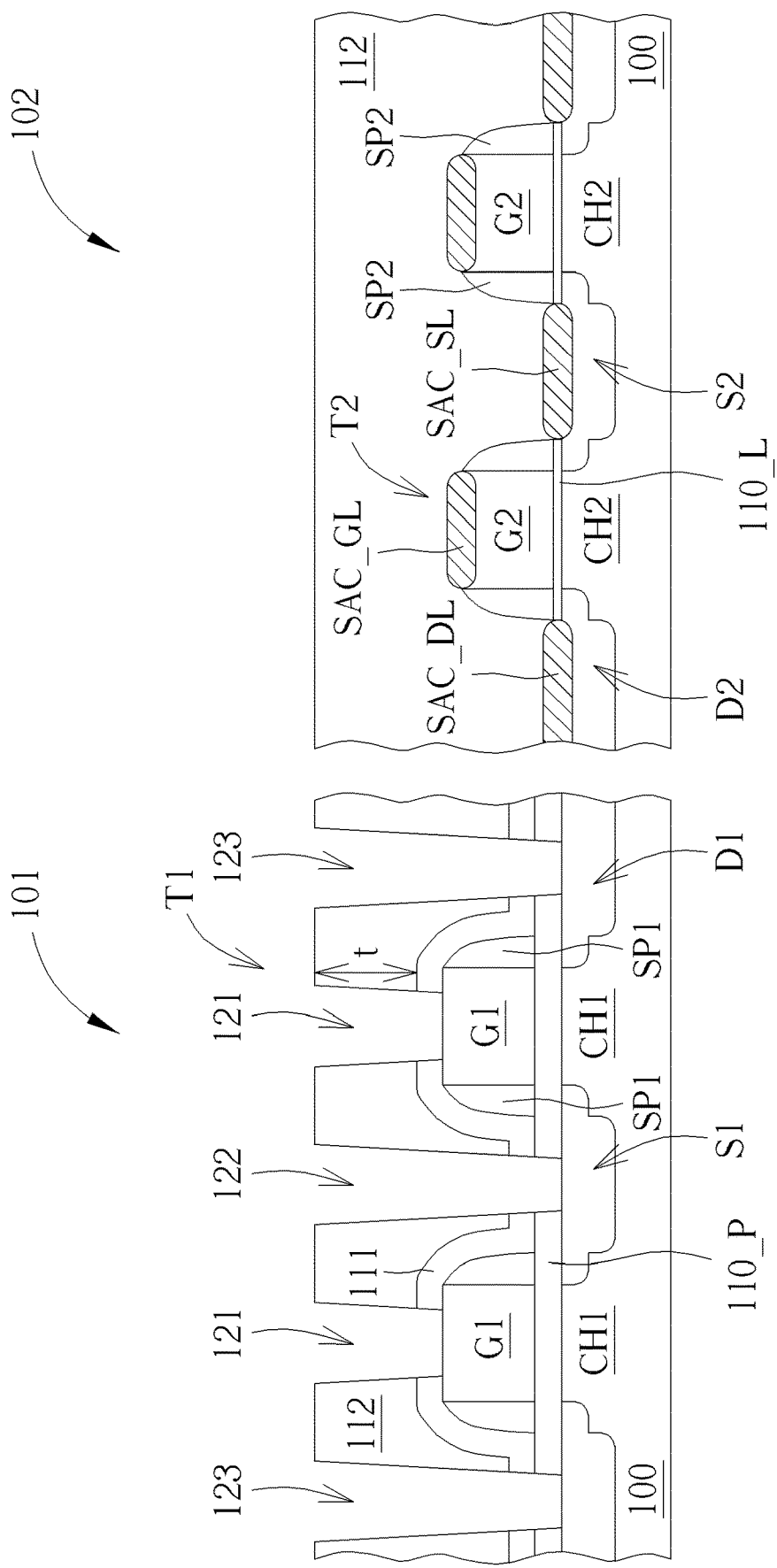

As shown in FIG. 2, a lithography process and an etching process are subsequently performed to form a contact hole 121, a contact hole 122, and a contact hole 123 in the interlayer dielectric layer 112 on the gate G1, the source region S1, and the drain region D1 of the MOS transistor T1 in the pixel region 101, respectively. The contact hole 121 penetrates through the interlayer dielectric layer 112 and the salicide block layer 111 to expose a portion of the gate electrode G1. The contact hole 122 penetrates through the interlayer dielectric layer 112 and the salicide block layer 111 to expose a portion of the source region S1. The contact hole 123 penetrates through the interlayer dielectric layer 112 and the salicide block layer 111 to expose a portion of the drain region D1. At this point, no contact hole is formed in the interlayer dielectric layer 112 on the gate G2, the source region S2, and the drain region D2 of the MOS transistor T2 in the logic circuit region 102.

Figure 3:
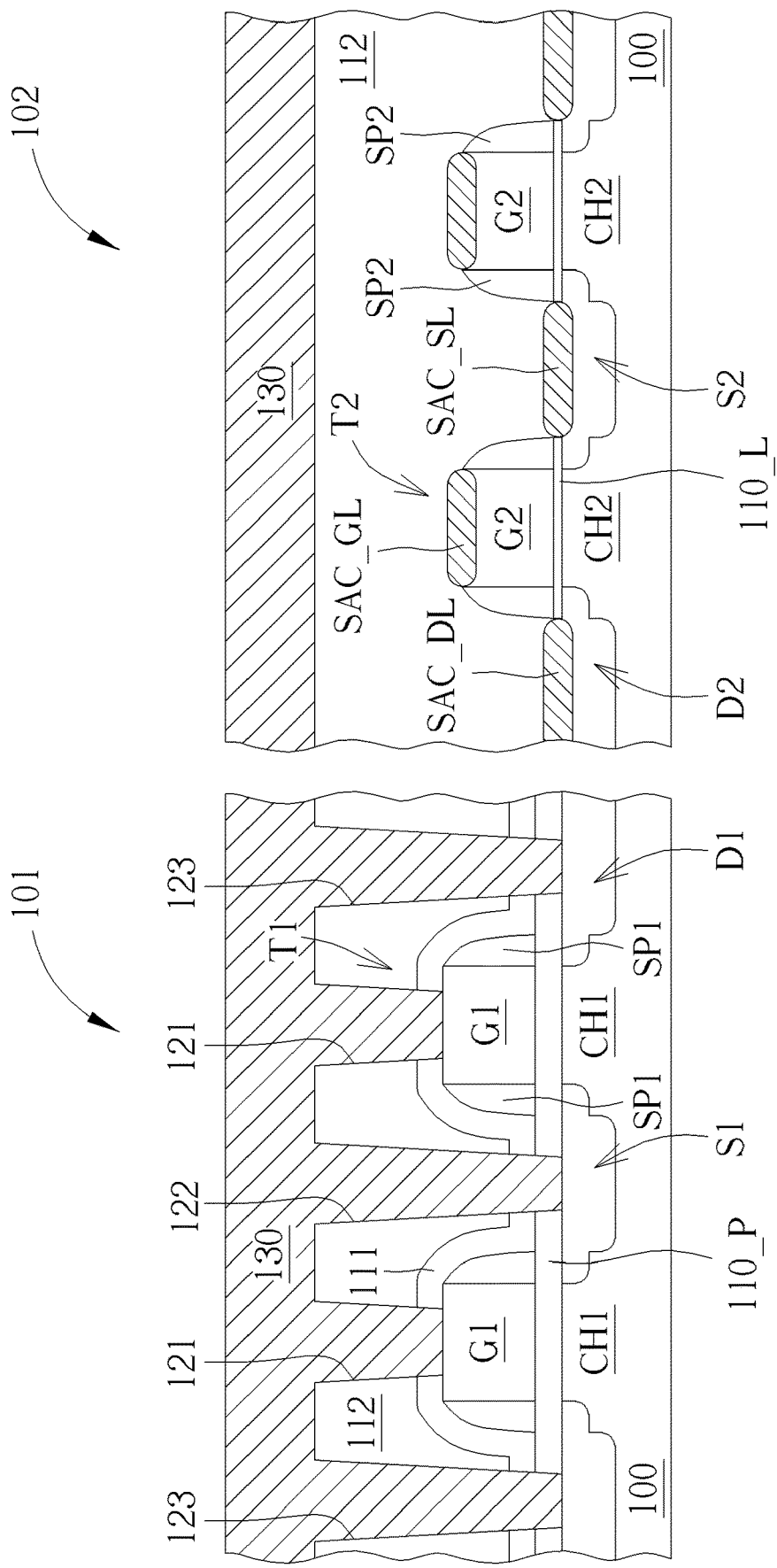

Next, as shown in FIG. 3, a doped polysilicon layer 130 is deposited on the semiconductor substrate 100, for example, an $N^+$ doped polysilicon layer, so that the doped polysilicon layer 130 fills the contact hole 121, the contact hole 122 and contact hole 123. According to the embodiment of the present invention, the doped polysilicon layer 130 may be formed by a method such as a chemical vapor deposition (CVD) process, but is not limited thereto.

Figure 4:
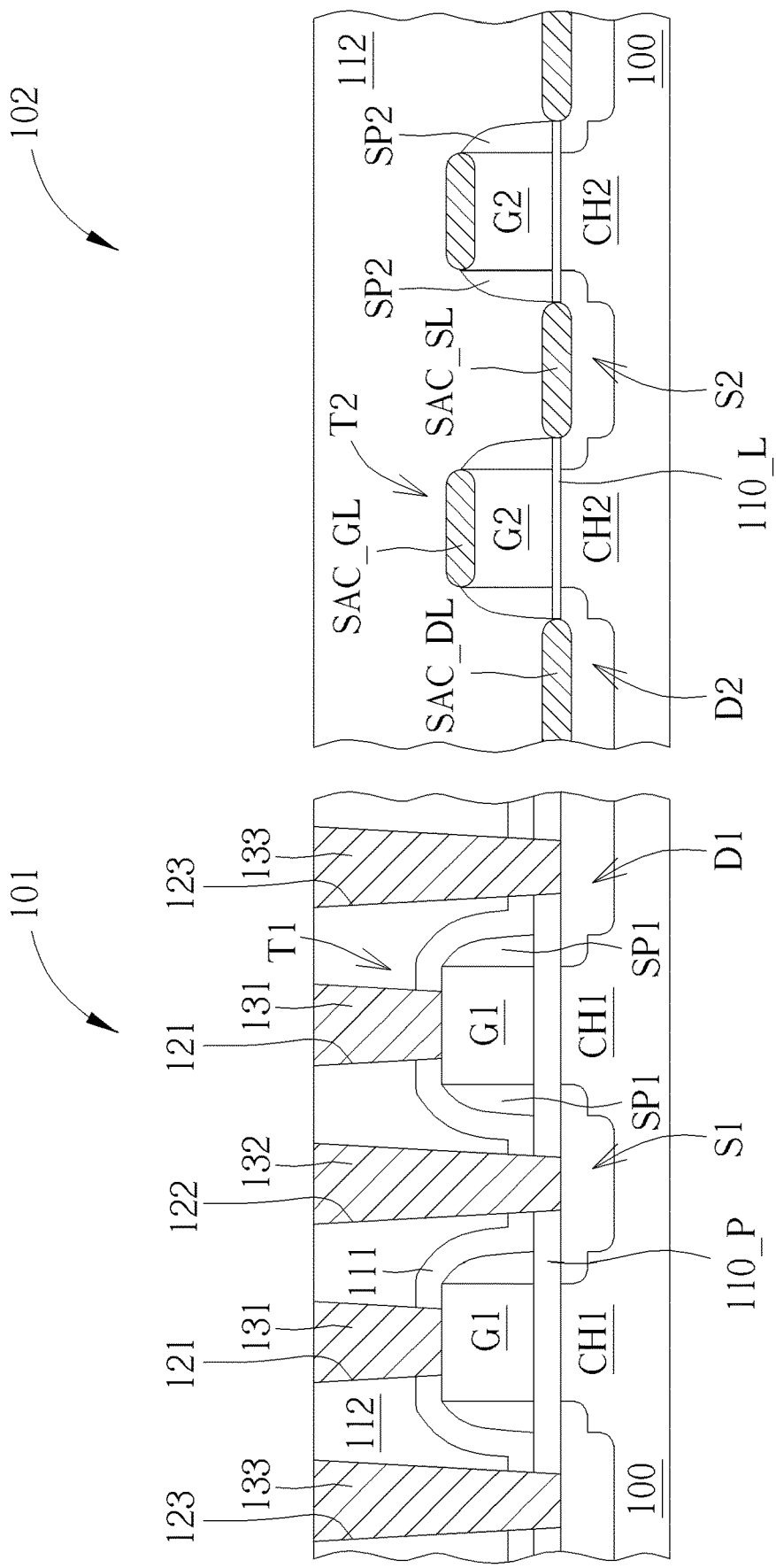

As shown in FIG. 4, a chemical mechanical polishing (CMP) process is then performed to polish away the excess doped polysilicon layer 130 above the interlayer dielectric layer 112, so that a doped polysilicon plug 131, a doped polysilicon plug 132, and a doped polysilicon plug 133 are formed in the contact hole 121, the contact hole 122, and the contact hole 123 respectively. The doped polysilicon plug 131 is in direct contact with the gate G1, the doped polysilicon plug 132 is in direct contact with the source region S1, and the doped polysilicon plug 133 is in direct contact with the drain region D1. At this point, the upper surfaces of the doped polysilicon plug 131, the doped polysilicon plug 132, and the doped polysilicon plug 133 are flush with the upper surface of the interlayer dielectric layer 112.

Figure 5:
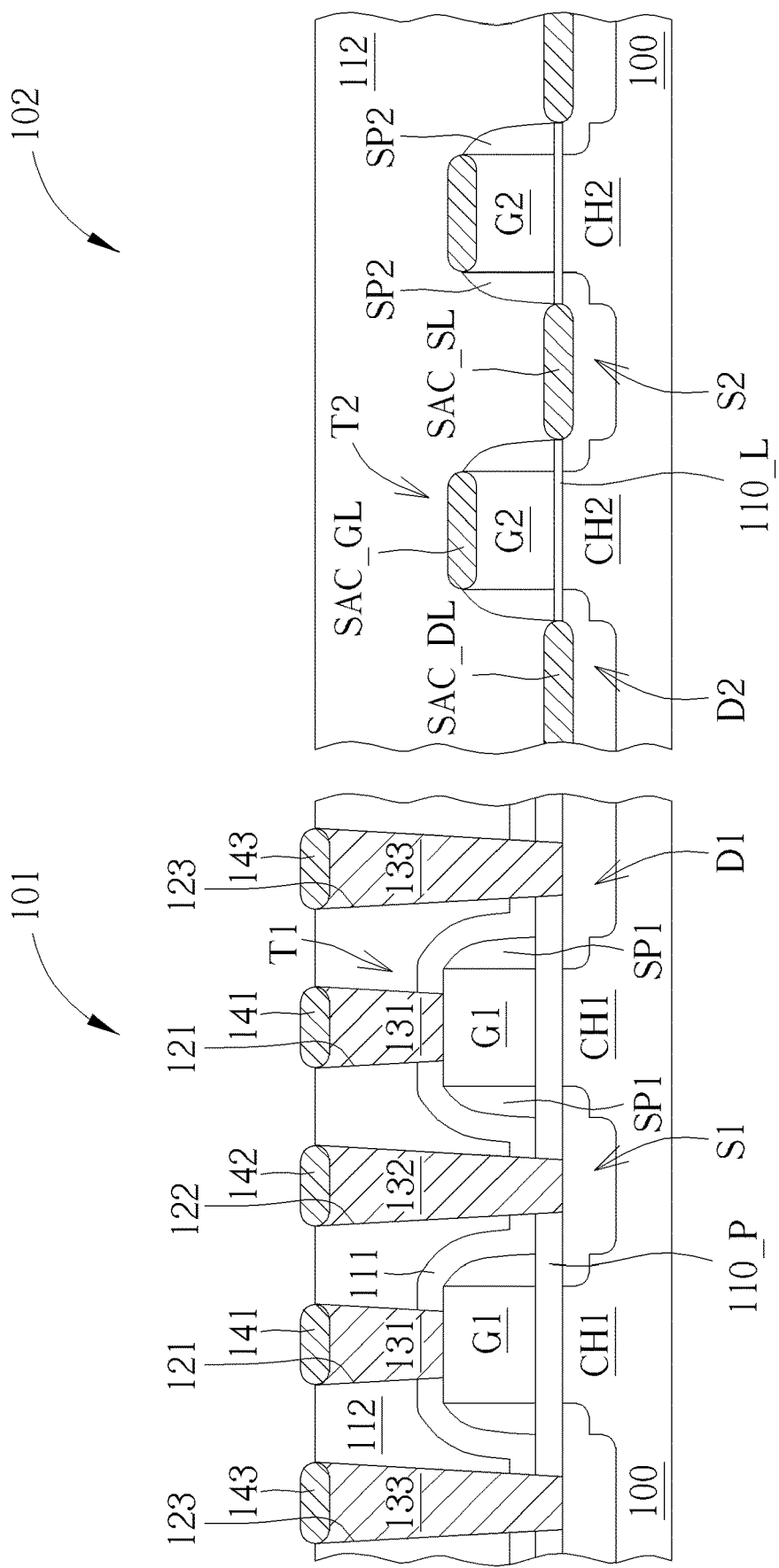

As shown in FIG. 5, the pixel region 101 is subjected to a self-aligned silicide process to form a self-aligned silicide layer 141, a self-aligned silicide layer 142, and a self-aligned silicide layer 143 on the exposed upper surfaces of the doped polysilicon plug 131, the doped polysilicon plug 132, and the doped polysilicon plug 133, respectively. According to the embodiment of the present invention, the self-aligned silicide layer 141, the self-aligned silicide layer 142, and the self-aligned silicide layer 143 are coplanar. According to the embodiment of the present invention, the self-aligned silicide layer 141, the self-aligned silicide layer 142 and the self-aligned silicide layer 143 may comprise titanium silicide, cobalt silicide, nickel silicide, or tungsten silicide.

Figure 6:
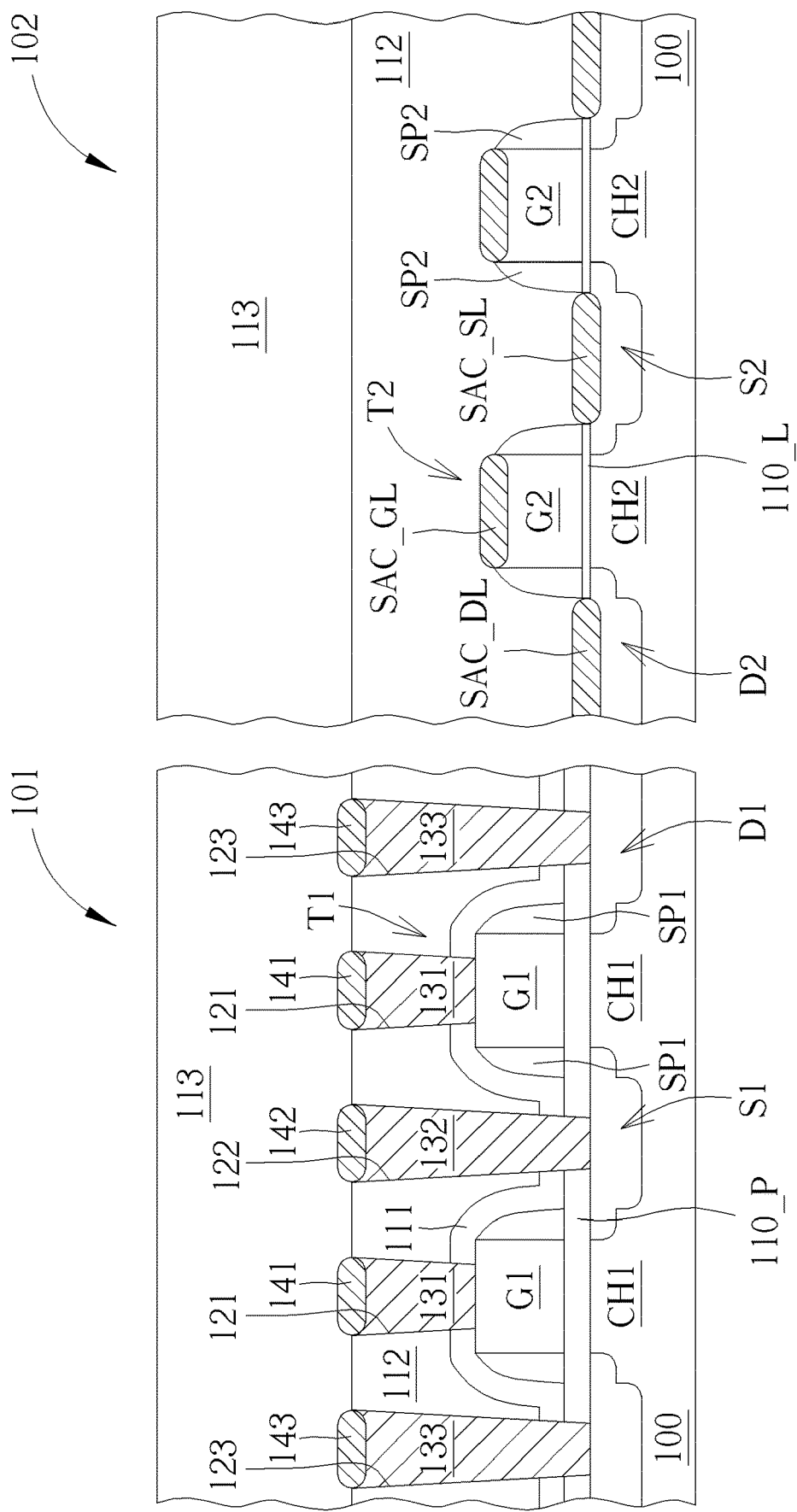

As shown in FIG. 6, an interlayer dielectric layer 113 is formed directly on the interlayer dielectric layer 112 and covers the self-aligned silicide layer 141, the self-aligned silicide layer 142, and the self-aligned silicide layer 143. The interlayer dielectric layer 113 may be a silicon oxide layer or a low dielectric constant material layer, but is not limited thereto. According to the embodiment of the present invention, the thickness of the interlayer dielectric layer 113 is greater than the thickness of the interlayer dielectric layer 112.

Figure 7:
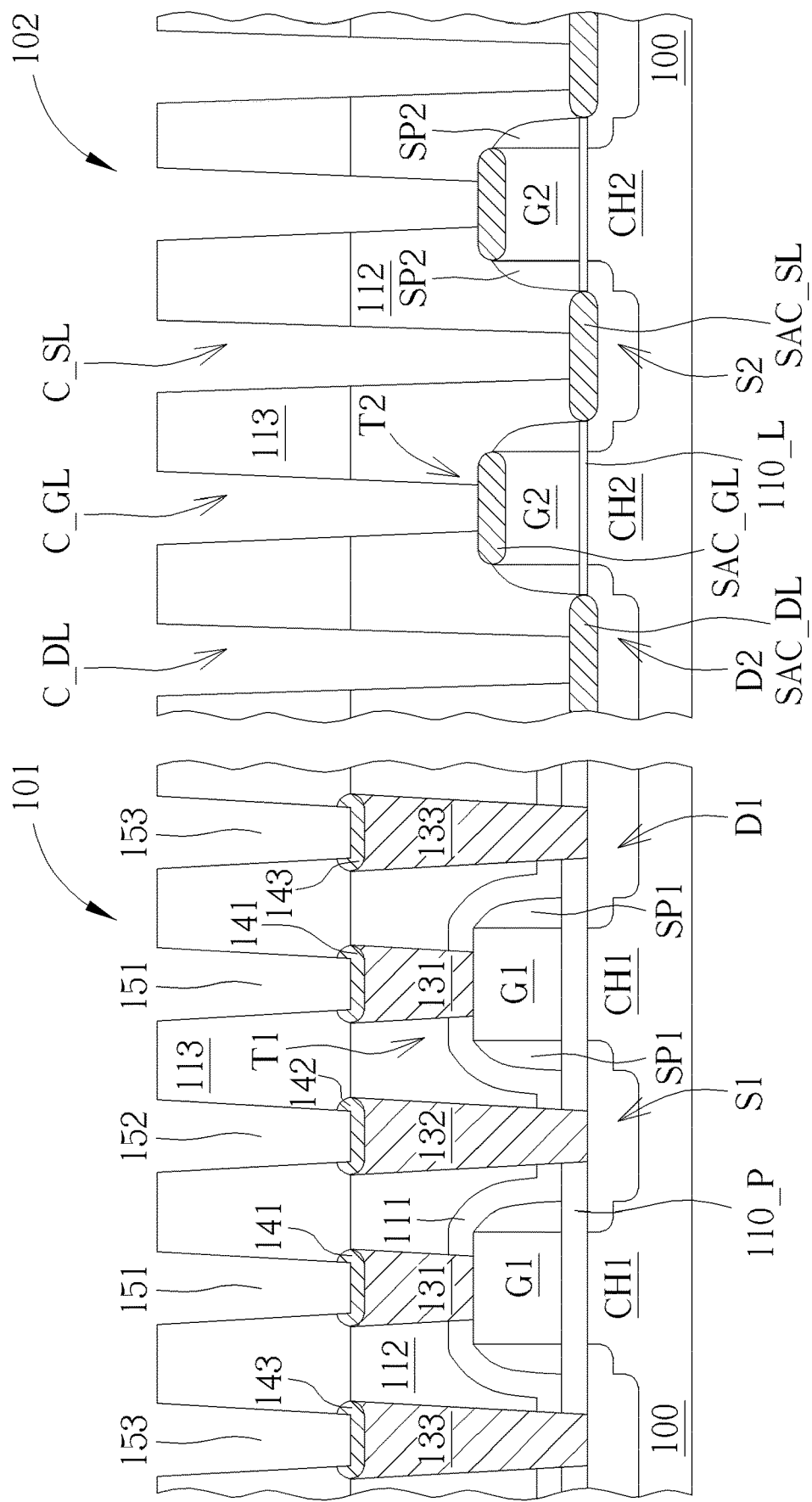

As shown in FIG. 7, a lithography process and an etching process are then performed to form a contact hole 151, a contact hole 152, and a contact hole 153 in the interlayer dielectric layer 113 on the gate G1, the source region S1, and the drain region D1 of the MOS transistor T1 in the pixel region 101, respectively. The contact hole 151 penetrates through the interlayer dielectric layer 113 to expose a portion of the self-aligned silicide layer 141, and the contact hole 152 penetrates through the interlayer dielectric layer 113 to expose a portion of the self-aligned silicide layer 142, and the contact hole 153 penetrates through the interlayer dielectric layer 113 to exposes a portion of the self-aligned silicide layer 143. In addition, a contact hole C_GL, a contact hole C_SL, and a contact hole C_DL are also formed in the interlayer dielectric layers 113 and the interlayer dielectric layer 112 above the self-aligned silicide layer SAC_GL, the self-aligned silicide layer SAC_SL, and the self-aligned silicide layer SAC_DL of the MOS transistor T2 in the logic circuit region 102, respectively.

Figure 8:
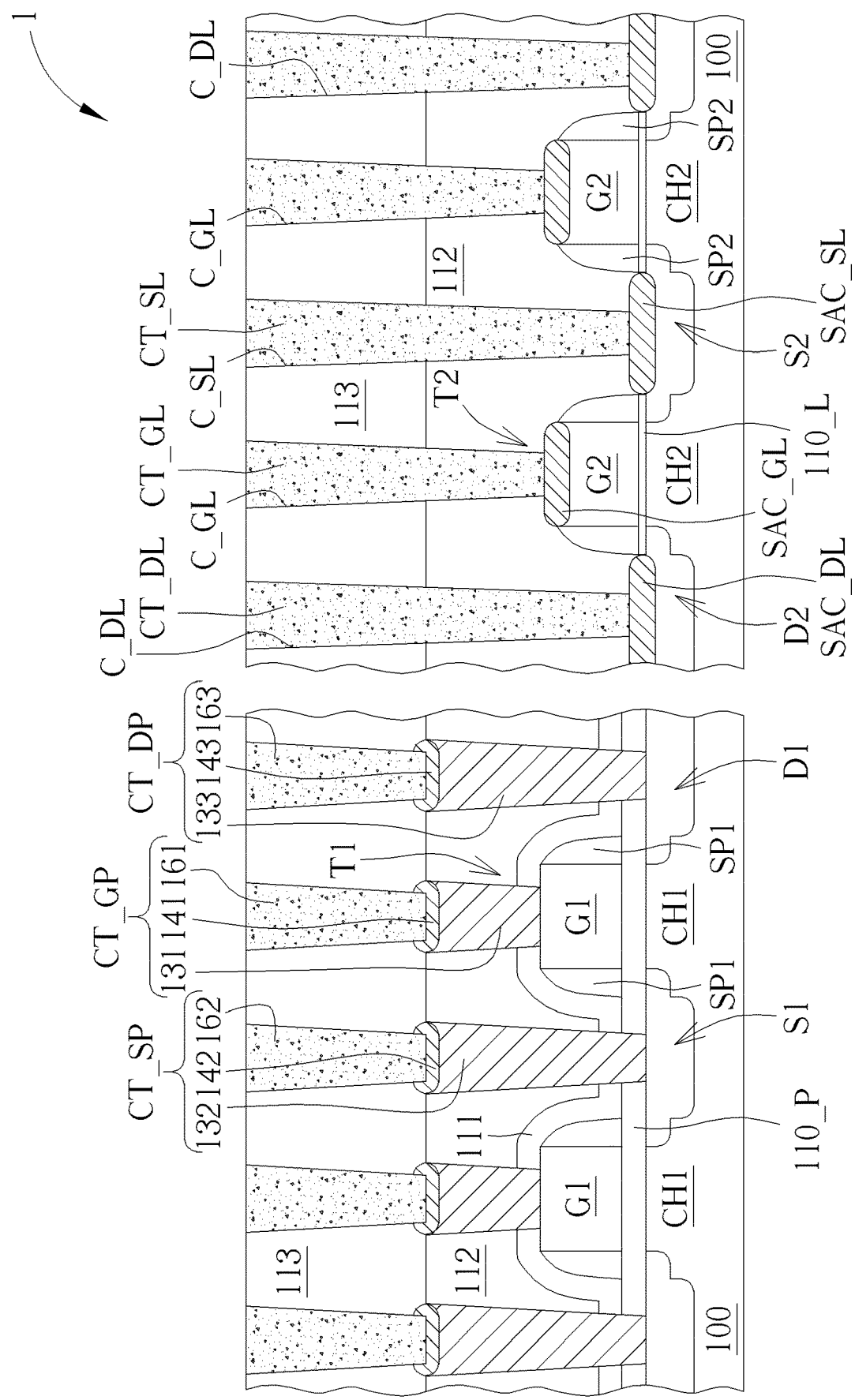

Finally, as shown in FIG. 8, a conductive metal layer 161, a conductive metal layer 162, and a conductive metal layer 163 are formed in the contact hole 151, the contact hole 152, and the contact hole 153 in the pixel region 101, respectively. At the same time, a conductive metal layer CT_GL, a conductive metal layer CT_SL, and a conductive metal layer CT_DL are respectively formed in the contact hole C_GL, the contact hole C_SL, and the contact hole C_DL in the logic circuit region 102. In the pixel region 101, the conductive metal layer 161, the self-aligned silicide layer 141, and the doped polysilicon plug 131 constitute a hybrid gate contact CT_GP, and the conductive metal layer 162 and the self-aligned silicide layer 142 and doped polysilicon plug 132 constitute a hybrid source contact CT_SP, and the conductive metal layer 163, self-aligned silicide layer 143, and doped polysilicon plug 133 constitute a hybrid drain contact CT_DP. According to an embodiment of the present invention, the conductive metal layer 161, the conductive metal layer 162, and the conductive metal layer 163 may comprise tungsten, aluminum, titanium, titanium nitride, tantalum, or tantalum nitride.

Structurally, as shown in FIG. 8, the semiconductor image sensor device 1 of the present invention includes: a semiconductor substrate 100 including an image-sensing pixel region 101; and a MOS transistor T1 disposed in the image-sensing pixel region 101 on the semiconductor substrate 100. The MOS transistor T1 includes a source region S1, a drain region D1 separated from the source region S1, a channel region CH1 between the source region S1 and the drain region D1, and a gate G1 on the channel region CH1. A salicide block layer 111 covers the MOS transistor T1 and the image-sensing pixel region 101. An interlayer dielectric layer 112 covers the salicide block layer 111. An interlayer dielectric layer 113 is disposed directly on interlayer dielectric layer 112. A source contact CT_SP is on the source region S1. The source contact CT_SP extends through the interlayer dielectric layer 113, the interlayer dielectric layer 112, and the salicide block layer 111. The source contact CT_SP includes a doped polysilicon plug 132 in the interlayer dielectric layer 112, a self-aligned silicide layer (or silicide layer) 142 disposed on the doped polysilicon plug 132, and a conductive metal layer 162 in the interlayer dielectric layer 113 and on the self-aligned silicide layer 142. A drain contact CT_DP is on the drain region D1. The drain contact CT_DP extends through the interlayer dielectric layer 113, the interlayer dielectric layer 112, and the salicide block layer 111. The drain contact CT_DP includes a doped polysilicon plug 133 in the interlayer dielectric layer 112, and the self-aligned silicide layer 143 on the doped polysilicon plug 133, and the conductive metal layer 163 in the interlayer dielectric layer 113 and on the self-aligned silicide layer 143.

According to the embodiment of the present invention, the doped polysilicon plug 132 is in direct contact with the source region S1, and the doped polysilicon plug 133 is in direct contact with the drain region D1. According to the embodiment of the present invention, the doped polysilicon plug 132 and the doped polysilicon plug 133 include $N^+$ doped polysilicon.

According to the embodiment of the present invention, the self-aligned silicide layer 142 and the self-aligned silicide layer 143 are coplanar.

According to an embodiment of the present invention, the semiconductor image sensor device 1 of the present invention further includes: a gate contact CT_GP, which is located on the gate G1, and the gate contact CT_GP extends through the interlayer dielectric layer 113, the interlayer dielectric layer 112, and the salicide block layer 111, and the gate contact CT_GP includes a doped polysilicon plug 131 in the interlayer dielectric layer 112, a self-aligned silicide layer 141 disposed on the doped polysilicon plug 131, and a conductive metal layer 161 in the interlayer dielectric layer 113 and on the self-aligned silicide layer 141.

According to the embodiment of the present invention, the self-aligned silicide layer 141, the self-aligned silicide layer 142, and the self-aligned silicide layer 143 are coplanar. According to the embodiment of the present invention, the self-aligned silicide layer 141, the self-aligned silicide layer 142, and the self-aligned silicide layer 143 include titanium silicide, cobalt silicide, nickel silicide, or tungsten silicide.

According to an embodiment of the present invention, the conductive metal layer 161, the conductive metal layer 162, and the conductive metal layer 163 include tungsten, aluminum, titanium, titanium nitride, tantalum, or tantalum nitride.

According to an embodiment of the present invention, the thickness of the interlayer dielectric layer 112 directly above the gate G1 is less than 300 angstroms.

According to an embodiment of the present invention, the silicide blocking layer 111 includes a silicon oxide layer.

Figure 9:
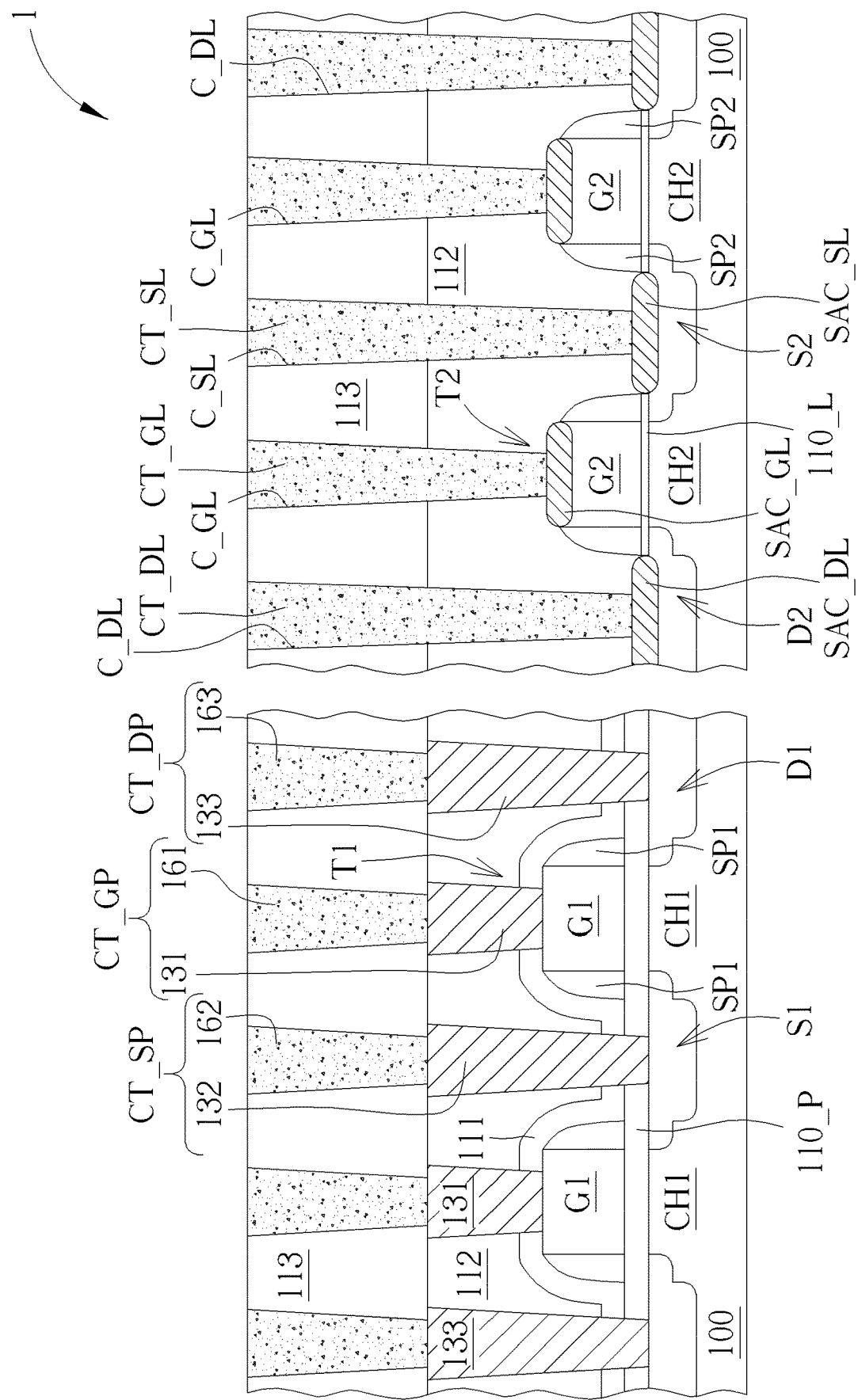
FIG. 9 is a schematic cross-sectional view of a semiconductor image sensor device according to another embodiment of the present invention.

Please refer to FIG. 9, which is a schematic cross-sectional view of a semiconductor image sensor device according to another embodiment of the present invention. The structure of the semiconductor image sensor device in FIG. 9 is substantially the same as the structure in FIG. 8 except that the gate contact CT_GP, the source contact CT_SP, and the drain contact CT_DP of the semiconductor image sensor device in FIG. 9 do not comprise a self-aligned silicide layer. As shown in FIG. 9, the conductive metal layer 161 of the gate contact CT_GP is in direct contact with the doped polysilicon plug 131, the conductive metal layer 162 of the source contact CT_SP is in direct contact with the doped poly silicon plug 132, and the conductive metal layer of the drain contact CT_DP 163 is in direct contact with the doped polysilicon plug 133.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor image sensor device, comprising:
   a semiconductor substrate comprising an image-sensing pixel region;
   a MOS transistor disposed on said semiconductor substrate within said image-sensing pixel region, wherein said MOS transistor comprises a source region, a drain region spaced apart from said source region, a channel region between said source region and said drain region, and a gate over said channel region;
   a salicide block (SAB) layer covering said MOS transistor and said image-sensing pixel region;
   a first interlayer dielectric (ILD) layer covering said SAB layer;
   a second ILD layer directly on said first ILD layer;
   a source contact on said source region, said source contact extending through said second ILD layer, said first ILD layer, and said SAB layer, and said source contact comprising a first doped polysilicon plug in said first ILD layer and a first conductive metal layer in said second ILD layer; and
   a drain contact on said drain region, said drain contact extending through said second ILD layer, said first ILD layer, and said SAB layer, and said drain contact comprising a second doped polysilicon plug in said first ILD layer and a second conductive metal layer in said second ILD layer.

2. The semiconductor image sensor device according to claim 1, wherein said first doped polysilicon plug is in direct contact with said source region and said second doped polysilicon plug is in direct contact with said drain region.

3. The semiconductor image sensor device according to claim 1, wherein said first doped polysilicon plug and said second doped polysilicon plug comprise $N^+$ doped polysilicon.

4. The semiconductor image sensor device according to claim 1 further comprising:
   a gate contact on said gate, said gate contact extending through said second ILD layer, said first ILD layer, and said SAB layer, and said gate contact comprising a third doped polysilicon plug in said first ILD layer and a third conductive metal layer in said second ILD layer.

5. The semiconductor image sensor device according to claim 4, wherein said first conductive metal layer, said second conductive metal layer, and said third conductive metal layer comprise tungsten, aluminum, titanium, titanium nitride, tantalum, or tantalum nitride.

6. The semiconductor image sensor device according to claim 4, wherein said third doped polysilicon plug is in direct contact with said third conductive metal layer.

7. The semiconductor image sensor device according to claim 1, wherein a thickness of said first ILD layer directly above said gate is smaller than 300 angstroms.

8. The semiconductor image sensor device according to claim 1, wherein said SAB layer comprises a silicon oxide layer.

9. The semiconductor image sensor device according to claim 1, wherein said first doped polysilicon plug is in direct contact with said first conductive metal layer.

10. The semiconductor image sensor device according to claim 9, wherein said second doped polysilicon plug is in direct contact with said second conductive metal layer.

11. The semiconductor image sensor device according to claim 1, wherein no silicide layer is disposed on said source region, said drain region or said gate.

* * * * *